United States Patent
Wu et al.

(10) Patent No.: US 10,346,093 B1
(45) Date of Patent: Jul. 9, 2019

(54) MEMORY ARRANGEMENT FOR TENSOR DATA

(71) Applicant: Xilinx, Inc., San Jose, CA (US)

(72) Inventors: Ephrem C. Wu, San Mateo, CA (US); Xiaoqian Zhang, San Jose, CA (US); David Berman, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/923,950

(22) Filed: Mar. 16, 2018

(51) Int. Cl.
| | |
|---|---|
| G06F 12/00 | (2006.01) |
| G06F 3/06 | (2006.01) |
| G11C 7/10 | (2006.01) |
| G06F 12/06 | (2006.01) |
| G06N 3/08 | (2006.01) |
| G06N 3/04 | (2006.01) |
| G06N 3/02 | (2006.01) |

(52) U.S. Cl.
CPC .......... *G06F 3/0659* (2013.01); *G06F 3/0604* (2013.01); *G06F 3/0656* (2013.01); *G06F 12/0653* (2013.01); *G06N 3/02* (2013.01); *G06N 3/04* (2013.01); *G06N 3/0472* (2013.01); *G06N 3/08* (2013.01); *G11C 7/10* (2013.01); *G06F 2212/1048* (2013.01)

(58) Field of Classification Search
CPC .... G06F 3/0659; G06F 3/0604; G06F 3/0656; G06F 12/0653; G06F 2212/1048; G06N 3/08; G06N 3/02; G06N 3/04; G06N 3/0472; G11C 7/10
See application file for complete search history.

(56) References Cited

U.S. PATENT DOCUMENTS

2017/0103303 A1* 4/2017 Henry ................ G06F 15/82

OTHER PUBLICATIONS

Krizhevsky, Alex et al., "ImageNet Classification with Deep Convolutional Neural Networks," Proc. of Neural Information Processing System 2012, Dec. 3, 2012, pp. 1-9, https://papers.nips.cc/paper/4824-imagenet-classification-with-deep-convolutional-neural-networks.pdf.
Simonyan, Karen et al., "Very Deep Convolutional Networks for Large-Scale Image Recognition," Proc. of the 3rd International Conference on Learning Representations (ICLR2015), May 7, 2015, pp. 1-14, https://arxiv.org/pdf/1409.1556v6.pdf.

(Continued)

*Primary Examiner* — Shawn X Gu
(74) *Attorney, Agent, or Firm* — LeRoy D. Maunu

(57) ABSTRACT

Disclosed circuitry includes RAM circuits, a memory controller, and an array of processing circuits. Each RAM circuit includes a read port and a write port. The memory controller accesses tensor data arranged in banks of tensor buffers in the RAM circuits. The memory controller is coupled to each read port by shared read control signal lines and to each write port by shared write control signal lines. The memory controller generates read control and write control signals for accessing different ones of the tensor buffers at different times. The array of processing circuits is coupled to one of the RAM circuits. The array includes multiple rows and multiple of columns of processing circuits for performing tensor operations on the tensor data. The processing circuits in each row in each array of processing circuits are coupled to input the same tensor data.

20 Claims, 9 Drawing Sheets

(56) References Cited

OTHER PUBLICATIONS

Szegedy, Christian et al. "Going Deeper with Convolutions," Proc. of the 2015 IEEE Conference on Computer Vision and Pattern Recognition (CVPR), Jun. 8, 2015, pp. 1-9, http://www.cv-foundation.org/openaccess/content_cvpr_2015/papers/Szegedy_Going_Deeper With_2015_CVPR_paper.pdf.

He, Kaiming et al. "Deep Residual Learning for Image Recognition," Proc. of the 2016 IEEE Conference on Computer Vision and Pattern Recognition (CVPR), Jun. 26, 2016, pp. 1-9, http://www.cv-foundation.org/openaccess/content_cvpr_2016/papers/He_Deep_Residual_Learning_CVPR_2016_paper.pdf.

Shen, Yongming et al. "Overcoming Resource Underutilization in Spatial CNN Accelerators," Proc. of the 2016 26th International Conference on Field Programmable Logic and Applications (FPL), Aug. 29, 2016, pp. 1-4, IEEE, Piscataway, New Jersey, USA.

Farabet, Clement et al. "CNP: An FPGA-based processor for Convolutional Networks," Proc. of the 19th International Conference on Field-Programmable Logic and Applications (FPL), Aug. 31, 2009, pp. 1-6, IEEE, Piscataway, New Jersey, USA.

Eppstein, David, "Parallel Recognition of Series-Parallel Graphs," Information and Computation, May 1992, pp. 41-55, vol. 98, Issue 1, http://www.sciencedirect.com/science/article/pii/089054019290041D?via%3Dihub#.

\* cited by examiner

MEMORY ARRANGEMENT FOR TENSOR DATA

TECHNICAL FIELD

The disclosure generally relates to a flexible and scalable memory arrangement for tensor data in neural networks.

BACKGROUND

Data in neural networks are viewed as tensors and stored as multiple-dimensional arrays. For instance, vectors are rank-1 tensors and matrices are rank-2 tensors. A 2D image with three color channels (R, G, and B) is a rank-3 tensor. 3D medical images collected over time can be organized as a rank-4 tensor.

A neural network can be represented as a computation graph in which each node in the graph is a computation layer. A data tensor memory can be disposed between two layers so that one layer produces a data tensor for the next layer to consume.

AlexNet and VGGNet are examples of neural networks implemented as a series of layers. The output of one layer depends solely on the output of the preceding layer, with the exception of the input layer, which does not receive input from another layer. Recent convolutional neural networks with higher accuracy have a more general neural-net topology. Rather than being a series of layers, the layers in these networks are the nodes of a two-terminal series-parallel digraph, which may also be referred to a "series-parallel graph" or "sp-graph." GoogLeNet and ResNet are examples of neural networks that exhibit a series-parallel graph topology.

A spectrum of hardware architectures can process these layers. At one end of the spectrum, a layer module or simply a "module" is implemented to compute the output of each layer. At the other end of the spectrum, a one-size-fits all module processes the layers iteratively. In between these two extremes, the layers can be partitioned across a network of modules such that each module computes the output of one or more layers, but no module computes for all layers. Through a data tensor memory, one module sends data to the next. A module that processes multiple layers also feeds output data from one layer back to itself for iterative layer processing. The design of this memory is the subject of this invention.

Because of the recent success of convolutional neural networks applied to image classification, many implementations of the data tensor memory are image-centric. The two-dimensional (2D) image from each channel is spatially distributed to a 2D array of arithmetic units for parallel processing. A drawback to this approach is that when the image dimensions change, the arithmetic array needs to change to keep the efficiency high, and the data tensor memory must be re-designed accordingly. Furthermore, if the arithmetic array cannot be re-dimensioned, efficiency drops.

SUMMARY

A disclosed circuit arrangement includes a plurality of RAM circuits, a memory controller, and an array of processing circuits. Each RAM circuit includes at least one read port and at least one write port. The memory controller is configured to access tensor data arranged in a plurality of banks of tensor buffers in the plurality of RAM circuits. The memory controller is coupled to the at least one read port of each of the plurality of RAM circuits by a shared read address bus and a shared read enable signal line, and is coupled to the at least one write port of each of the plurality of RAM circuits by a shared write address bus and a respective subset of a plurality of write enable signal lines. The memory controller is further configured to generate read addresses, a read enable signal, write addresses, and write enable signals for accessing different ones of the tensor buffers in the plurality of RAM circuits at different times. The array of processing circuits includes a plurality of rows and a plurality of columns of processing circuits. Each subset of a plurality of subsets of rows of the processing elements is coupled to the at least one read port of a respective one of the RAM circuits by a read data bus. A last row of processing elements is coupled to the at least one write port of each of the plurality of RAM circuits by a write data bus. The array of processing circuits is configured to perform tensor operations on the tensor data, and the processing circuits in each row in each array of processing circuits are coupled to input the same tensor data.

Another disclosed circuit arrangement includes a plurality of N modules that are coupled in a pipeline. A second module through the Nth module of the plurality of N modules in the pipeline inputs tensor data output from a previous module. Each module includes a plurality of RAM circuits, a memory controller, and an array of processing circuits. Each RAM circuit includes at least one read port and at least one write port. The memory controller is configured to access tensor data arranged in a plurality of banks of tensor buffers in the plurality of RAM circuits. The memory controller is coupled to the at least one read port of each of the plurality of RAM circuits by a shared read address bus and a shared read enable signal line, and is coupled to the at least one write port of each of the plurality of RAM circuits by a shared write address bus and a respective subset of a plurality of write enable signal lines. The memory controller is further configured to generate read addresses, a read enable signal, write addresses, and write enable signals for accessing different ones of the tensor buffers in the plurality of RAM circuits at different times. The array of processing circuits includes a plurality of rows and a plurality of columns of processing circuits. Each subset of a plurality of subsets of rows of the processing elements is coupled to the at least one read port of a respective one of the RAM circuits by a read data bus. A last row of processing elements is coupled to the at least one write port of each of the plurality of RAM circuits by a write data bus. The array of processing circuits is configured to perform tensor operations on the tensor data, and the processing circuits in each row in each array of processing circuits are coupled to input the same tensor data.

A disclosed method includes generating by a memory controller, read addresses, a read enable signal, write addresses, and a plurality of write enable signals for accessing tensor data in different ones of a plurality of tensor buffers at different times. The tensor data is arranged in a plurality of banks of tensor buffers in a plurality of RAM circuits, and each RAM circuit includes at least one read port and at least one write port. The method transmits each read address and read enable signal in parallel from the memory controller to the at least one read port of all of the plurality of RAM circuits and transmits each write address in parallel from the memory controller to the at least one write port of all of the plurality of RAM circuits. The method further includes transmitting a subset of the plurality of write enable signals to the at least one write port of one of the plurality of RAM circuits, respectively. The method inputs tensor data from the plurality of RAM circuits to an array of processing circuits. The array of processing circuits includes a plurality of rows and a plurality of columns of processing circuits. Each subset of a plurality of subsets of rows of the processing elements is coupled to the at least one read port of a respective one of the RAM circuits by a read data bus. A last row of processing elements is coupled to the at least one write port of each of the plurality of RAM circuits by a write data bus. The method further includes performing tensor operations on the tensor data by each array of processing circuits.

Other features will be recognized from consideration of the Detailed Description and Claims, which follow.

BRIEF DESCRIPTION OF THE DRAWINGS

Various aspects and features of the disclosed systems and methods will become apparent upon review of the following detailed description and upon reference to the drawings in which.

DETAILED DESCRIPTION

Figure 1:
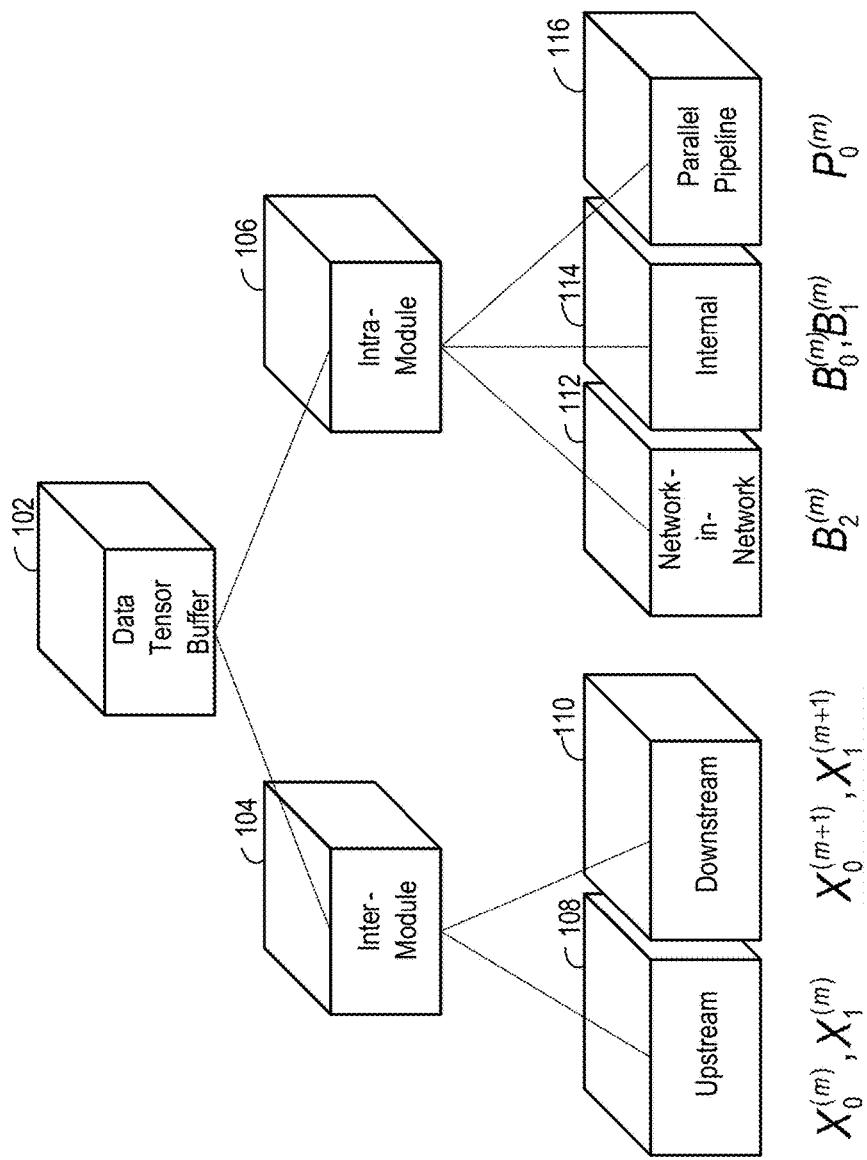
FIG. 1 shows a hierarchical relationship between types of tensor buffers.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

According to the disclosed circuit arrangements, a group of RAMs are used together to form a flexible multi-ported data tensor memory to deliver a desired data bandwidth to an array of processing circuits. The group of RAMs is structured to allow the processing circuitry, which processes multiple layers, to feed output data from one layer back for processing of the next layer. The disclosed memory arrangement is not limited to two-dimensional image applications and is scalable for different applications.

The disclosed circuits and methods can include multiple RAM circuits, each having at least one read port and at least one write port. A memory controller is configured to access tensor data stored in multiple banks of tensor buffers in the RAM circuits. The memory controller is coupled to each read port of the RAM circuits by a shared read address bus and a shared read enable signal line. The memory controller is also coupled to each write port of the RAM circuits by a shared write address bus and a respective subset of write enable signal lines. Different ones of the tensor buffers in the RAM circuits are accessed at different times with the memory controller generating read addresses, a read enable signal, write addresses, and write enable signals to the RAM circuits.

An array of processing circuits is coupled to the RAM circuits. A respective subset of the rows of the array of processing circuits is coupled to the data pins of each read port of one of the RAM circuits. A last row of processing elements in the array is coupled to the write pins of each write port of all the RAM circuits. The processing circuits in each row in the array of processing circuits are coupled to input the same tensor data from the respective RAM circuit. The array of processing circuits includes multiple rows and multiple columns of processing circuits configured to perform tensor operations on the tensor data.

The disclosed memory arrangement provides a number of benefits over prior approaches. All tensor banks share the same read and write addresses in parallel. The memory controller can be oblivious to the number of tensor banks, which maximizes portability of the memory controller hardware and the software.

The memory arrangement can be adapted to different native SRAM dimensions. For example, Xilinx BRAM and UltraRAM support a limited set of dimensions, whereas ASICs can specify any custom SRAM dimensions before tape-out. This disclosed memory arrangement can be readily adapted to the native dimensions of the underlying SRAMs. SRAMs can be used as building blocks to first build a tensor bank of tensor buffers for serving an array of processing elements (PEs). The data bandwidth of the tensor bank matches the bandwidth of part or all of the array of PEs. When one bank does not have enough bandwidth, multiple, parallel banks can be constructed to deliver the required bandwidth.

Organizing tensor buffers into tensor banks decouples the physical dimensions of the underlying SRAMs from upper-layer programs, making the hardware architecture portable across platforms such as a field programmable gate arrays (FPGAs), a system-on-chip (SoC), a system-in-package (SiP), and an application-specific integrated circuit (ASIC).

FIG. 1 shows a hierarchical relationship between types of tensor buffers. A data tensor memory comprises one or more two-port RAMs (one read port and one write port). The two-port RAMs can be arranged as banks of tensor buffers. A tensor buffer is a portion of a memory that is allocated for storage of a data tensor. Each bank can implement two to six tensor buffers, for example. A bank of tensor buffers is a group of multiple tensor buffers for which storage is provided by one or more RAMs, and two or more of the tensor buffers in a bank share write control and write data and two or more of the tensor buffers in a bank share read control. The buffers in each bank may use up to two read ports and two write ports.

Tensor buffers 102 can be categorized as inter-module 104 or intra-module tensor buffers 106. An inter-module tensor buffer is a tensor buffer that is output by module m and processed by module m+1. An intra-module tensor buffer is a tensor buffer generated by module m and further processed by module m. In denoting tensor buffers, a tensor buffer processed by module m is designated with superscript (m). When the context is clear, the superscript (m) may be dropped for intra-module buffers.

An inter-module tensor buffer can be either an upstream 108 or a downstream 110 tensor buffer. Upstream tensor buffers are identified as $X_0^{(m)}$ and $X_1^{(m)}$, and downstream tensor buffers are identified as $X_0^{(m+1)}$ and $X_1^{(m+1)}$. An upstream tensor buffer is a tensor buffer input to module m from module (m−1). A downstream tensor buffer is a tensor buffer output from module m to module (m+1).

An intra-module tensor buffer 106 can be a network-in-network tensor buffer 112, an internal tensor buffer 114, or a parallel pipeline parallel buffer 116. A network-in-network tensor buffer is a tensor buffer that is generated by one set of operations of a layer of a neural network and processed by another set of operations of a different layer in the same compute subgraph (e.g., 3×3_reduce inside Inception_3a generates a network-in-network tensor for the 3×3 layer that is also within the same Inception 3a compute subgraph) of the neural network. An internal tensor buffer is a tensor buffer that is generated by the operations of one layer and processed by the operations of the next layer in a different compute subgraph. A parallel pipeline tensor buffer is a tensor buffer that can be processed by a module in parallel with upstream inter-module, network-in-network, and network-in-network internal tensor buffers.

Separation of tensor buffers into inter-module buffers and intra-module buffers enables modules to be designed independently to operate in a pipeline, thereby maximizing design reuse. Designers of one module do not need to match the output sample schedule precisely (i.e. down to the cycle) with the input sample schedule of the next module in the pipeline. Matching the average output sample rate of one module to the input sample rate of the next module is sufficient.

Figure 2:
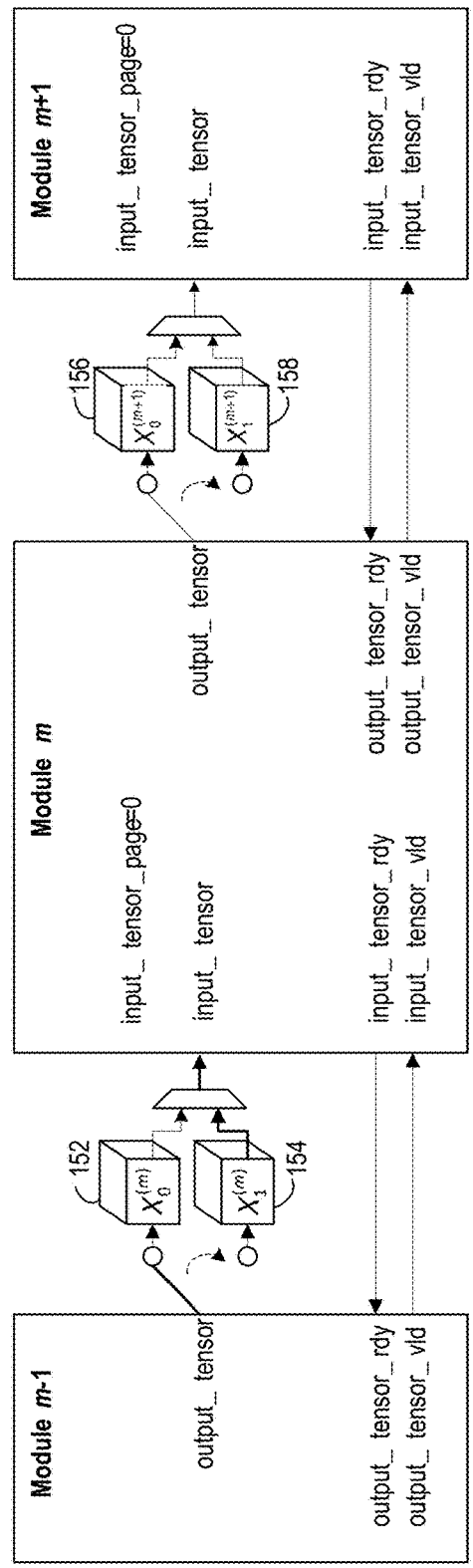
FIG. 2 shows modules (m−1), m, and (m+1) and inter-module tensor buffers that implement a ping-pong memory between modules of a neural network.

FIG. 2 shows modules (m−1), m, and (m+1) and inter-module tensor buffers that implement a ping-pong memory between modules of a neural network. Inter-module tensor buffers $X_0^{(m)}$ 152 and $X_1^{(m)}$ 154 form a ping-pong memory between layer module m−1 and layer module m. Similarly, inter-module tensor buffers $X_0^{(m+1)}$ 156 and $X_0^{(m+1)}$ 158 form a ping-pong memory between layer module m and layer module m+1. Module m−1 produces a data tensor for module m to consume. While module m−1 writes into tensor buffer $X_0^{(m)}$, module m can only read from tensor buffer $X_0^{(m)}$. Likewise, while module m−1 writes into tensor buffer $X_0^{(m)}$, module m can only read from tensor buffer $X_0^{(m)}$.

In one implementation, a binary state signal, xwrite, (not shown) can indicate which of the two buffers is for write (implying that the other is for read). For example, when xwrite is 0, $X_0^{(m)}$ should be used for write, and $X_0^{(m)}$ should be used for read. When xwrite is 1, $X_0^{(m)}$ should be used for write, and $X_0^{(m)}$ should be used for read.

Ready and valid signals can be used to signal when the inter-module tensor buffers are ready for reading and writing by the modules. For example, an asserted input_tensor_rdy signal upstream from module m to module m−1 indicates that $X_{xwrite}^{(m)}$ is ready for writing a data tensor by module m−1. An asserted input_tensor_vld signal from module m−1 to m indicates that $X_{1-xwrite}^{(m)}$ is ready for reading a data tensor by module m.

Multiple modules can be implemented to carry out one or more of the operations and activities described herein and/or shown in the figures. In these contexts, a "module" is a circuit that carries out one or more of these or related operations/activities, such as providing storage for tensor buffers, accessing tensor buffers, and processing tensor data. For example, a module can include a combination of RAM circuitry, programmable logic circuitry, application-specific integrated circuitry (ASIC), and/or one or more microprocessor circuits.

Figure 3:
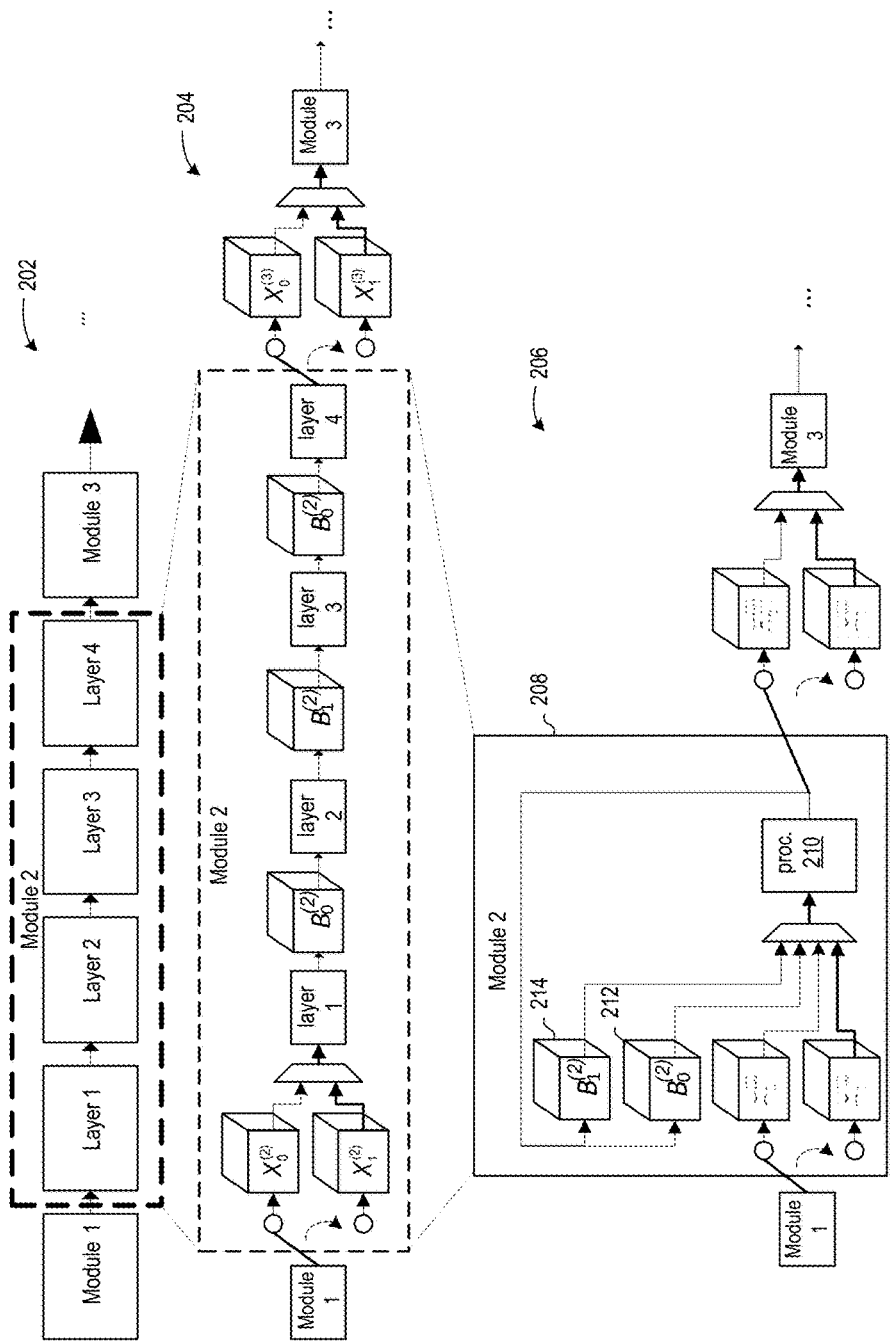
FIG. 3 shows an exemplary multi-level circuit diagram in which a module performs operations of multiple layers of a neural network, and intra-module tensor buffers are used as a ping-pong memory to feed output of one layer back to the module for the next layer of processing.

FIG. 3 shows an exemplary multi-level circuit diagram in which a module performs operations of multiple layers of a neural network, and intra-module tensor buffers are used as a ping-pong memory to feed output of one layer back to the module for the next layer of processing. Level 202 shows modules 1, 2, and 3, with module 1 generating data for processing by module 2, and module 2 generating data for processing by module 3. Module 2 performs the processing of layers 1-4 of a hypothetical neural network. Level 204 shows the inter-module tensor buffers and intra-module tensor buffers employed by module 2 in the processing of layers 1-4 of the neural network. Level 206 shows a more detailed view of module 2.

Data tensor buffers $B_0^{(m)}$ and $B_1^{(m)}$ are exemplary intra-module tensor buffers used by module 2 in processing layers 1-4. The intra-module tensor buffers $B_0^{(m)}$ and $B_1^{(m)}$ form a ping-pong memory for module 2 to send the output of one layer of processing back to the module for performing the processing of the next layer. The state of an exemplary int_write signal can be used by the module to determine which buffer can be written to.

The operations of layer 1 input a data tensor from one of the inter-module tensor buffers ($X_0^{(m)}$ or $X_0^{(m)}$) and output a data tensor to an intra-module tensor buffer $B_0^{(m)}$, which is input by the operations of layer 2. Layer 2 in turn outputs a data tensor to a different intra-module tensor buffer $B_0^{(m)}$, which is input by the operations of layer 3, and so on until layer 4, which outputs a data tensor to one of the next set of inter-module tensor buffers ($X_0^{(m+1)}$ or $X_0^{(m+1)}$). The operations of alternating layers read from one intra-module tensor buffer and write to another intra-module tensor buffer. For example, level 204 shows that the operations of layers 2 and 4 read from intra-module tensor buffer $B_0^{(m)}$, and the operations of layers 1 and 3 write to $B_0^{(m)}$.

Figure 6:
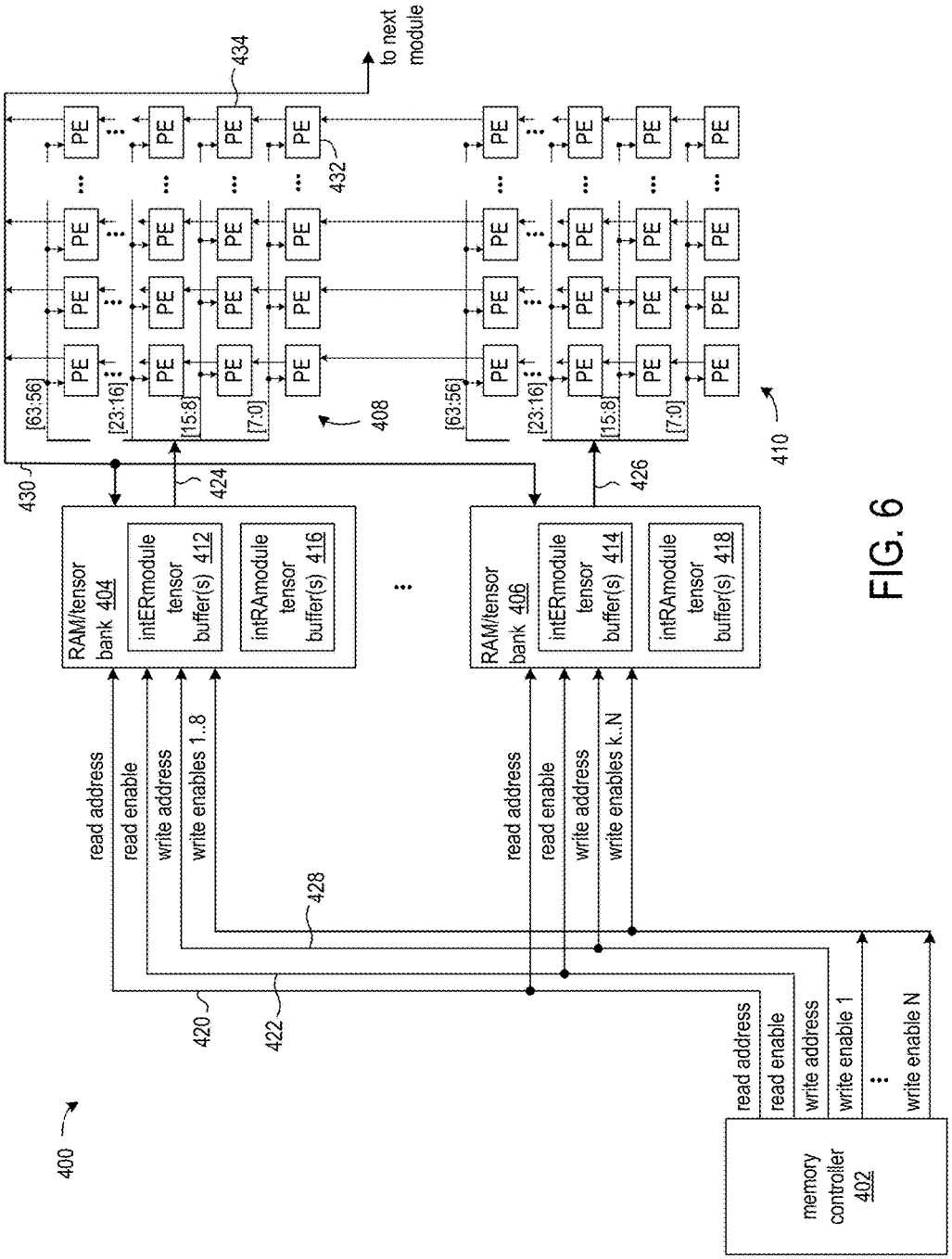
FIG. 6 shows a circuit arrangement for processing multiple layers of a neural network and including a memory arrangement for storing and accessing multiple banks of tensor buffers.
Figure 7:
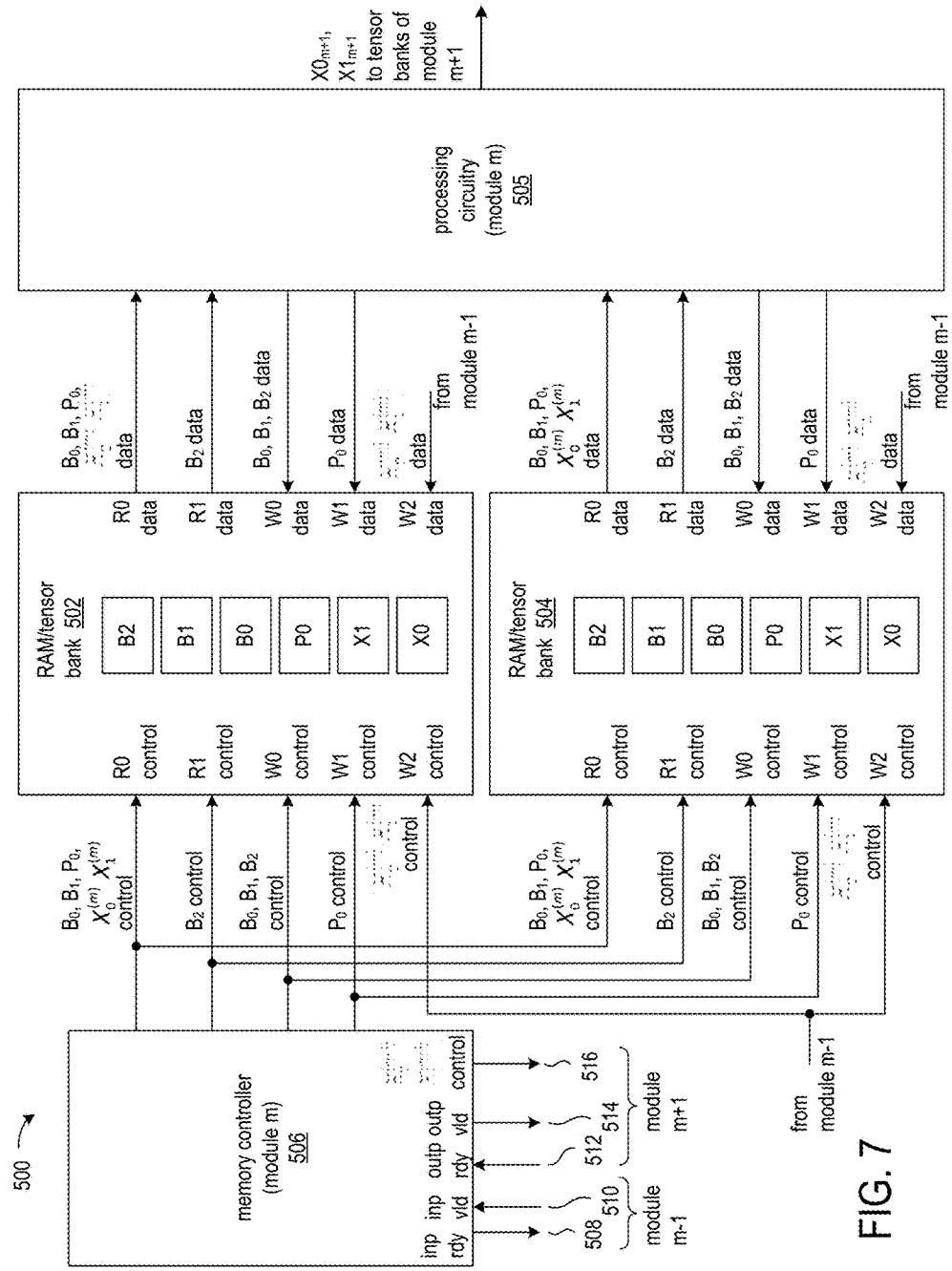
FIG. 7 shows a circuit arrangement for processing multiple layers of a neural network and including a memory arrangement for storing and accessing multiple banks of tensor buffers according to an exemplary application.

Level 206 shows module 2 as a block of circuitry 208 that includes processing circuitry 210 that operates with tensor buffers $B_0^{(2)}$, $B_1^{(2)}$, $X_0^{(2)}$, and $X_1^{(2)}$ while performing the operations of multiple layers of a neural network. The tensor buffers can be stored as a bank of tensor buffers in one or more RAMs as shown in FIGS. 6 and 7. The processing circuitry 210 can be implemented as a multi-core microprocessor, in programmable logic, or as an application-specific integrated circuit (ASIC). The processing circuitry time multiplexes processing of the tensor buffers according to the schedule that is particular to the neural network.

Figure 4:
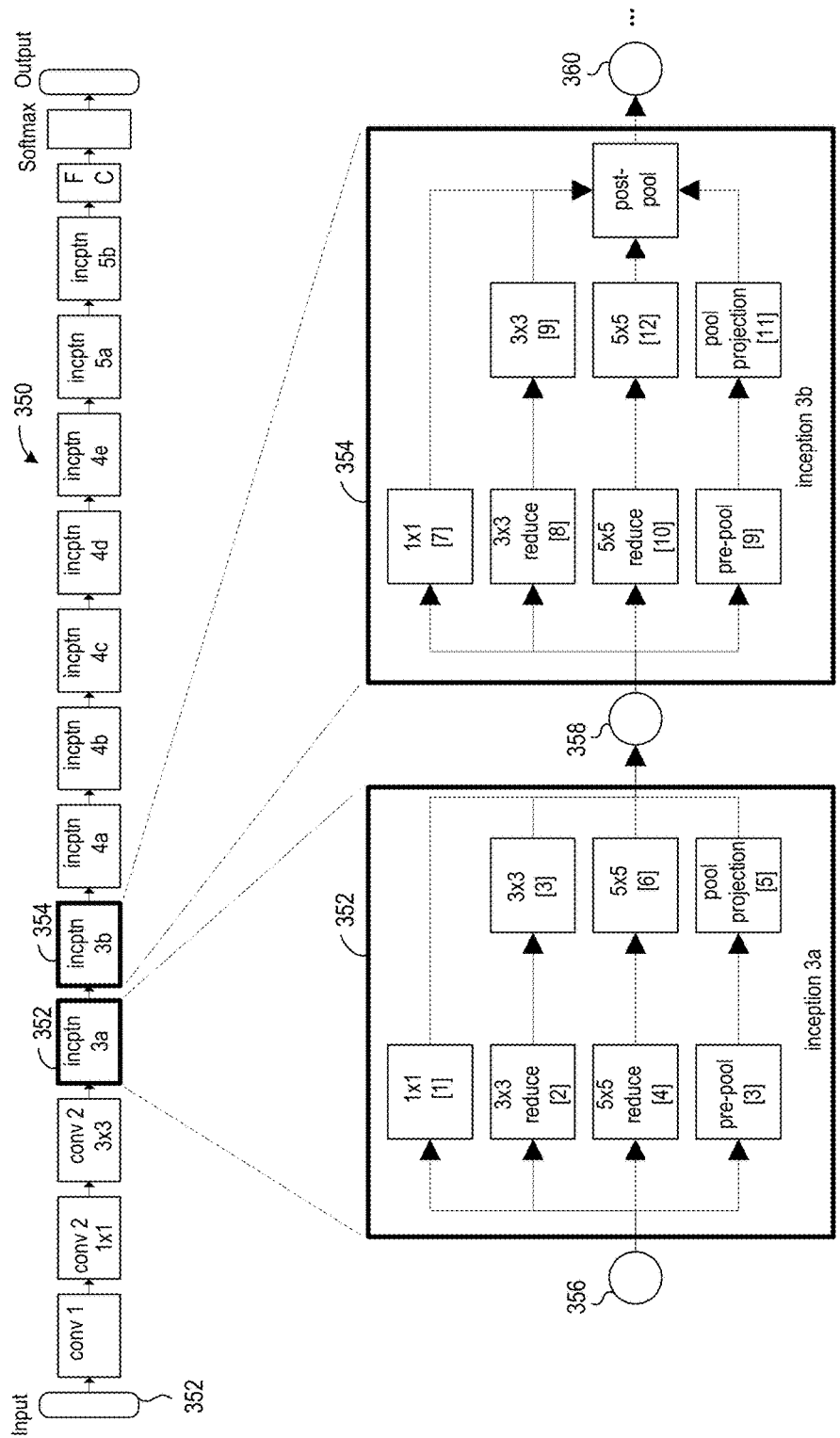
FIG. 4 shows in an upper portion of the diagram a pipeline view operations in five layers of a GoogleLeNet neural network, and in the lower portion of the diagram an exploded view of the inception layer 3a operations and inception layer 3b operations.
Figure 5:
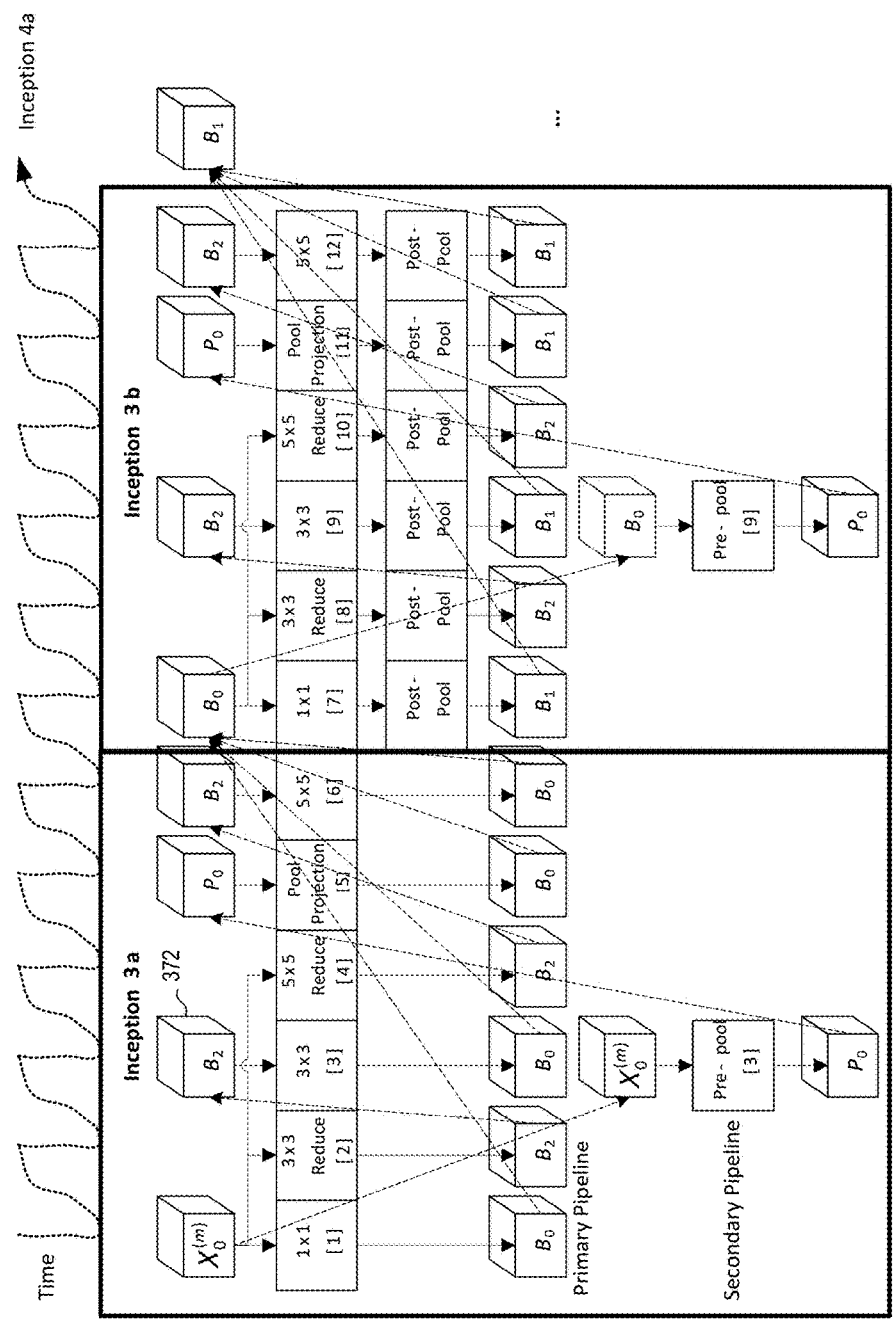
FIG. 5 illustrates an operation schedule and tensor buffer usage.

FIGS. 4 and 5 show application of the disclosed approaches for implementing banks of tensor buffers to a particular, exemplary neural network. The exemplary neural network is GoogLeNet. Though various circuits and methods are described with reference to certain aspects of the GoogLeNet neural network, it will be recognized that the disclosed approaches are adaptable and applicable to other neural networks.

In an exemplary implementation, a multi-layer module can include a dual-pipeline compute unit that is coupled to the tensor buffers and that computes all inception layers from inception 3a 352 to inception 5b 354. The tensor buffers are implemented in tensor banks that share read ports and write ports as shown in FIGS. 6 and 7. Tensor buffers that share the same port are allocated different addresses in the tensor banks.

FIG. 4 shows in the upper portion of the diagram a pipeline view operations in seven layers within an Inception subgraph (which may alternatively be referred to as an "Inception module") of a GoogleLeNet neural network 350, and in the lower portion of the diagram an exploded view of the inception layer 3a operations and inception layer 3b operations. Inception layers 3a and 3b are shown as blocks 352 and 354, and in the lower portion of FIG. 4 dataflow within each of the inception layers 3a and 3b is illustrated. Circle 356 is the data tensor output by convolution layer 2 and input by inception layer 3a, circle 358 is the data tensor output by inception layer 3a and input by inception layer 3b, and circle 360 is the data tensor output by inception layer 3b and input by inception layer 4a. The bracketed numbers within the operation blocks indicate the order in which the operations of the blocks are performed. That is, the order of operations is the 1×1 convolution in inception layer 3a, the 3×3 reduction convolution in inception 3a, the 3×3 convolution in inception layer 3a, etc.

For neural networks that are series-parallel graphs, such as GoogleLeNet, a module can have an intra-module network-in-network tensor buffer $B_2^{(m)}$. In addition, a neural network such as GoogleLeNet can benefit from having a parallel processing pipeline, which can be implemented as an intra-module parallel pipeline tensor buffer $P_0^{(m)}$. All six tensor buffers $B_0^{(m)}$, $B_1^{(m)}$, $B_2^{(m)}$, $P_0^{(m)}$, $X_0^{(m)}$, and $X_1^{(m)}$ can be used for the inception operations in GoogLeNet.

The parallel processing pipeline is illustrated in FIG. 4 by both the 3×3 convolution and the pre-pool operation in inception layer 3a being $3^{rd}$ in the order of operations, and both the 3×3 convolution and the pre-pool operation in inception layer 3b being $9^{th}$ in the order of operations.

FIG. 5 illustrates an operation schedule and tensor buffer usage. FIG. 5 also shows how operations of each inception layer can be implemented as two parallel pipelines. A primary pipeline can perform fused convolution, rectifying linear unit (ReLU), and post-pooling operations, which are shown as blocks labeled 1×1, 3×3 reduce, 3×3, 5×5 reduce, pool projection, and 5×5. A secondary pipeline can perform pre-pooling operations as shown by the pre-pool block. The disclosed approaches for managing tensor banks are not limited by the particular operations of each pipeline. However, in structuring tensor banks the primary pipeline is the most compute-intensive and expensive, and should not have to wait for data. The tensor buffers together keep the expensive primary pipeline busy.

Each operation is drawn as a square block and each tensor buffer is drawn as a cube. For space reasons, time in the exemplary schedule progresses in a serpentine fashion. Operations are drawn from left to right across the two parallel pipelines.

Arrows represent data dependencies. For instance in Inception 3a 352, the $1^{st}$, $3^{rd}$, $5^{th}$, and $6^{th}$ operations all write into different addresses of the tensor buffer $B_0$. The $1^{st}$, $3^{rd}$, $5^{th}$ and $6^{th}$ operations do not overwrite each other's output. Each solid directional line represents the dependency of an operation on a tensor buffer, and each dashed directional line represents a dependency of a tensor buffer at a later time in the schedule on processing of the same tensor buffer at an earlier time in the schedule. The output elements are combined in the tensor buffer $B_0$ and are all read by the $7^{th}$, $8^{th}$, $10^{th}$, and pre-pooling operations in Inception layer 3b 354. The $9^{th}$ pre-pooling and 3×3 convolution operations are performed in parallel. Other schedules are possible as long as no data dependency arrows point to the left. For example, the $4^{th}$ and the $5^{th}$ operations can be swapped.

Note that pre-pooling is always scheduled to operate in parallel with 3×3 convolution as the 3×3 convolution shares no tensor buffers with pre-pooling and happens to consume the most time in the primary pipeline, thereby presenting the least stringent timing constraints for designing the pre-pooler. Every operation in the primary pipeline has the data it needs when it is ready to consume data. As a result, the primary pipeline does not have to wait for data and is kept fully utilized.

The operations of 1×1, 3×3_reduce, and pre-pooling all read from the same input tensor buffer $X_0^{(m)}$. Unless the input tensor buffer has two or more read ports, pre-pooling cannot occur in parallel with 1×1 or 3×3_reduce. Pre-pooling and convolution use different hardware resources. Pre-pooling consists of comparators and convolution requires a matrix multiplier. As long as the two paths to not use the same memory port, the two processing paths can operate in parallel. For instance 3×3 reads from $B_2$ and writes to $B_0$ whereas pre-pooling reads from $X_0$ and writes to $P_0$. As a result, the two processing paths can operate in parallel.

The exemplary circuit arrangement supports two parallel processing pipelines: one processing pipeline for linear operations such as convolution, and another processing pipeline for non-linear operations such as max-pooling. Max-pooling is labeled "pre-pooling" in this description and figures in order to distinguish the max-pooling operation between two inception nodes (e.g., inception 3a and inception 3b). The parallel processing pipelines enable output from max-pool output to be immediately used by another convolution layer. For instance, in GoogLeNet, the max-pooling operation within inception 3b can occur in parallel with 3×3 convolution, because there is no data dependency between the two operations. The 3×3 convolution reads from the tensor buffer $B_2^{(m)}$ and writes to $B_1^{(m)}$ whereas max-pooling reads from $B_0^{(m)}$ and writes to $P_0^{(m)}$. Provided that max-pooling completes sooner than 3×3 convolution (which is often the case), the max-pooling output can then be immediately used by pool projection, which is shown as step 11 and performs 1×1 convolution. Without $P_0^{(m)}$, the convolver becomes idle when the pool projection layer needs data from the max-pooler. The tensor buffer $P_0^{(m)}$ enables max-pooling to operate in parallel and independently from the convolution pipeline. In other exemplary applications additional parallel tensor buffers, for example, $P_1^{(m)}$, $P_2^{(m)}$, . . . , can be used to support additional parallel processing pipelines within one module.

It will be recognized that the disclosed approaches support different processing schedules, from depth first to breadth first. When processing breadth first, deeper buffers may be required to accommodate the immediate production and later consumption of intermediate data elements. For example, the third and the fourth operations (3×3 and 5×5 reduce) could be swapped, but the buffer $B_2^{(m)}$ would need to deepen to accommodate more data elements that are not immediately consumed.

In another implementation, another tensor buffer $B_3^{(m)}$ can be included to operate as a ping-pong memory in conjunction with tensor buffer $B_2^{(m)}$. While 3×3 reduce writes to tensor buffer $B_2^{(m)}$, 3×3 convolution reads from tensor buffer $B_3^{(m)}$, and while 3×3 reduce writes to tensor buffer $B_3^{(m)}$, 3×3 convolution reads from tensor buffer $B_2^{(m)}$.

FIG. 6 shows a circuit arrangement 400 for processing multiple layers of a neural network and including a memory arrangement for storing and accessing multiple banks of tensor buffers. The circuit arrangement includes a memory controller 402, multiple RAMs 404, . . . , 406, and an array processing elements (PEs). The array of PEs includes multiple sections 408, . . . , 410 of PEs. Each of the RAMs is configured for storage of a tensor bank, which can include inter-module tensor buffers 412 and 414 and intra-module tensor buffers 416 and 418.

The implementation of the RAMs/tensor banks 404, . . . , 406 can vary according to application requirements. In an exemplary SoC/SiP implementation, the RAMs/tensor banks can be on-die SRAMs supplemented by larger in-package memory such as high-bandwidth memory (HBM) DRAM and off-chip memory double data rate (DDR) DRAM. The on-die SRAMs can be effectively operated in the on-die cache.

In an alternative implementation, the RAMs/tensor banks can be single-ported instead of dual-ported. The drawback is that read and write operations in the same RAM cannot overlap, thereby reducing processing array efficiency. For instance, a deep-pipelined array of PEs that reads from tensor buffer $B_0^{(m)}$ takes many cycles to produce and propagate output elements to tensor buffer $B_1^{(m)}$. When the array finishes reading the last data element for the current layer from $B_0^{(m)}$, the array cannot immediately begin reading data elements from $B_1^{(m)}$ to process the next layer because there is only one port, and that port is being used for write. As a result, in between layers, the array of PEs has to wait for the only port of $B_1^{(m)}$ to free up before beginning processing of the next layer.

The array sections 408, . . . , 410 of PEs are coupled to the RAMs 404, . . . , 406, respectively. Each array section of PEs processes the tensor buffers in the associated RAM/tensor bank, such as by performing the inception layer operations of fused convolution, rectifying linear unit (ReLU), and post-pooling. Each layer of the neural network is implemented as a deeply nested loop, and a controller runs nested loops on the array of PEs. The controller tracks all the loop ranges in order to control processing of data to completion.

For simplicity and flexibility, the basic RAM building block for tensor buffers may be of fixed dimensions, for instance, D words by M bits per word. For a neural network that uses 8-bit data elements, a 4096×64 RAM (4096 words by 64 bits per word) is a 4096×8-element memory building block. Each of the six exemplary tensor buffers has the same bandwidth (the same data bus width and the same maximum number of reads/writes per RAM cycle).

One RAM can implement more than one tensor buffer as long as the multiple tensor buffers can share the same read port and write port. For instance, if the circuit arrangement 400 includes a PE array having 12 sections 408, . . . , 410, the inter-module data tensor buffers $X_0^{(m)}$ and $X_1^{(m)}$ can be implemented in a single 4096×64 SRAM, which is the case for GoogLeNet v1 for Inception_3a, which takes a data tensor of 28×28×192=150,528 elements. The total number of parallel broadcast lanes into 12 PE sections 408, . . . , 410 is 96 lanes (drawn as rows of PEs in FIG. 6). Each lane inputs one one-byte-wide element. The 28×28×192 data tensor of Inception_3a distributed across the 96 lanes. In particular, the output from each 64-bit SRAM output connected to 8 lanes (a.k.a. one bank), and each lane is matched with one or more of the 192 channels. In the present example, each lane is matched with 28×28×192 channels/96 lanes=1586 elements per data tensor. With double buffering, there are 3172 elements (1586×2) to store. Since each SRAM in this example holds 4096 words×64 bits/word, it can hold 4096×8 elements, which is more than sufficient for the 3172 elements of storage needed for every 8 lanes. Multiple RAMs may implement one tensor buffer to gain sufficient depth.

In an exemplary implementation, a building-block RAM can have a throughput of one read and also one write per RAM clock cycle, and the RAM can deliver 8 elements per RAM clock cycle to an array of PEs. The RAM can also receive data at the same rate from the array of PEs. Each of the 8 elements feeds one particular row of the array at one-half the bandwidth. Specifically, 8 8-bit elements can be read out of a tensor buffer per RAM cycle, and the 8-bit elements are input to 8 rows of PEs, respectively. The PEs can operate at twice the RAM clock rate. More tensor buffer banks in parallel can be coupled to a larger processing array with more rows, making the data tensor memory scalable together with the processing element array.

Each row in the PE array can receive one channel from a data tensor. For an N-dimensional data tensor, each row performs an operation in N−1 dimensions. For example, in image processing, each row processes one color channel and each PE computes 2D convolution. If the input data is a rank-4 tensor, each channel is a rank-3 tensor (such as a 3D scan of an object). The data tensor buffer read address sequence can change to adapt to different data tensor dimensions. The fundamental structure of the data tensor buffer—from building-block RAMs to one bank of tensor buffers to a parallel set of banks—remains the same.

Each of the RAMs/tensor banks 404, . . . , 406 has a read port and a write port. In some implementations, the RAMs can have two write ports as shown in FIG. 7. The read ports of the RAMs are coupled to the same read control signal lines from the memory controller. That is, RAMs 404, . . . , 406 are coupled to receive the same read address 420 and read enable signal 422 from the memory controller. The data out pins of the read ports of RAMs 404 and 406 are connected to the read data bus signal lines 424 and 426. A data tensor spanning multiple RAMs can thereby be read in parallel from the RAMs and processed by respective subsets of rows of PEs in the array of PEs.

The write ports of the RAMs 404, . . . , 406 are coupled to the same write address lines 428. The memory controller provides respective sets of write enable signals to the write ports of the RAMs. The number of write enable signals provided to each RAM corresponds to the number of rows in each subset of rows of the array of PEs. Each array in the example includes 8 rows, and the memory controller provides respective write enable signals to each RAM. For M subsets of rows of PEs and each subset including R rows, the total number of write enable signals is M*R=N. RAM 404 receives write enable signals 1 through 8, and RAM 406 receives write enable signals k through N.

For a RAM/tensor bank that outputs 8-bytes (8-lane), each lane holds a subset of the channels. For instance, lane i holds channels $\phi_{in}N_1+i$, where $N_1=96$ is the number of PE crossbar array input lanes, is a simple round-robin channel-to-lane assignment. Note that this is not a lane-to-channel assignment as one lane may hold data from more than one channel. For a data tensor with 288 channels, $\phi_{in} \in \{0,1,2\}$.

Each exemplary section 408, . . . , 410 of PEs outputs 8, 8-bit tensor elements as shown by the outputs from the top rows of PEs in the sections. The combined outputs of the top-row PEs are connected to the data pins of the write ports of the RAMs. For example, the combined outputs of the top-row PEs of section 408 are shown as write data bus 430 connected to the data pins (not shown) of the write port of RAMs 404 and 406.

The PE array is a matrix-vector multiplier. In an exemplary application, each RAM/bank 404, . . . , 406 serves, 8 lanes (8 rows) of the PE array because there's usually a limit on the width of an SRAM that implements the RAM/bank. For example, an SRAM can be 64 bits wide, which would support 8, 8-bit lanes. In an exemplary application, the array of PEs has $N_1$ rows and $N_2$ columns, where $N_1$=96, and $N_2$=16. Thus, the array uses 96/8=12 SRAM banks.

An exemplary PE array is described in U.S. Pat. No. 9,779,786. The PE array performs the matrix-vector operation z=Wx. W is an $N_2 \times N_1$ matrix and x and z are both vectors with $N_1$ components. If the illustrated PE array is rotated by 90 degrees, the PE array rows would correspond to the matrix rows and the PE array columns would correspond to the matrix columns.

The exemplary array of PEs operates in a pipeline fashion. The output generated by a PE in one row and column of the array is provided as input to a PE in the next row and same column. For example, the output of PE 432 is input to PE 434. The column data output by the top PE in a column is stored in the memory RAM/tensor bank and represents a combination (e.g., sum) of the output data from the PEs in a corresponding column. The output of the PE array ($N_2$ columns) is fed back to the data write ports of all RAMs/banks 404, . . . , 406. The output can also be sent to the next module.

According to some implementations, a predetermined initialization value can be provided to the first PE, for example, PE 432, in each column. The PEs use the initialization value as if it were received as the output from a preceding PE, and the PEs in the array thereby have substantially identical logic and configuration. The initialization values can be provided by way of registers, RAM circuitry, or similar storage circuits located within the PEs.

In certain exemplary implementations for an image processing application, the RAMs 404, . . . , 406 initially store data corresponding to a set of input feature maps (IFMs) for an image. The system processes each IFM by applying two-dimensional (2D) convolution kernels to small portions of the image data ("slice data"). Input slice data for each IFM can be iteratively read by the memory controller 402 and output by the RAMs for processing by the array of PEs. Masks for at least two different convolution kernels can be stored in local memory circuitry (not shown) of the PEs and applied to the sets of input slice data.

As a particular example, image processing can be performed on IFMs that correspond to different color channels of a source image. Each color channel corresponds to a different set of optical frequencies. With respect to each row and iteration, the slice data can be taken from a similar portion of a different image for each row. PEs in a column each apply a different set of convolution kernels, which are defined relative to masks stored in local memory circuitry of the PEs. The results are stored in RAMs 404, . . . , 406 as output feature maps (OFMs).

FIG. 7 shows a circuit arrangement 500 for processing multiple layers of a neural network and including a memory arrangement for storing and accessing multiple banks of tensor buffers according to an exemplary application. The RAMs/tensor banks 502 and 504 store inter-module tensor buffers $X_0^{(m)}$ and $X_1^{(m)}$ and intra-module tensor buffers $B_0^{(m)}$, $B_1^{(m)}$, $B_2^{(m)}$, and $P_0^{(m)}$. Though only two RAM/tensor banks are illustrated, it will be appreciated that different applications may require additional RAMs/tensor banks. The processing circuitry 505 for module m can be implemented as the array of PEs as shown in FIG. 6 or as a microprocessor, for example.

Memory controller 506 for module m is coupled to the memory controllers for modules m−1 and m+1 and provides read and write control signals to the RAMs 502 and 504 for module m. The memory controller 506 transmits input ready signal 508 to the memory controller of module m−1 (not shown) to indicate when the memory controller of module m is ready for the memory controller of module m−1 to write data to one of the inter-module tensor buffers $X_0^{(m)}$ or $X_1^{(m)}$. The memory controller of m−1 provides the input valid signal 510 to memory controller 506 to indicate that memory controller 506 can initiate reading from one of the inter-module tensor buffers $X_0^{(m)}$ or $X_1^{(m)}$. Similarly, the memory controller of module m+1 provides the output ready signal 512 to memory controller 506 to indicate that memory controller 506 can write data to one of the inter-module tensor buffers $X_0^{(m+1)}$ or $X_1^{(m+1)}$, which are stored in RAMs/tensor banks (not shown) of module m+1. Memory controller 506 transmits output valid signal 514 to the memory controller of module m+1 to indicate that the memory controller of module m+1 can begin reading from one of the inter-module tensor buffers $X_0^{(m+1)}$ or $X_1^{(m+1)}$.

Table 1 summarizes the connections of the memory controller 506 of module m to the read and write ports of RAMs/tensor banks 502 and 504. The connections are also shown in FIG. 7.

TABLE 1

| Tensor Buffer | Read Port 0 (from module m) | Write Port 0 (from module m) | Read Port 1 (from module m) | Write Port 1 (from module m) | Write Port 2 |
|---|---|---|---|---|---|
| $X_0^{(m)}$ | X | | | | X (from module m-1) |
| $X_1^{(m)}$ | | | | | X (from module m-1) |
| $P_0^{(m)}$ | X | | | X | |
| $B_0^{(m)}$ | X | X | | | |
| $B_1^{(m)}$ | X | X | | | |
| $B_2^{(m)}$ | Optional | X | X (If not read by Port 0) | | |
| $X_0^{(m+1)}$ | | | | | X (from module m) |
| $X_1^{(m+1)}$ | | | | | X (from module m) |

Memory controller 506 provides the control signals (read address and read enable) to read port 0 (R0) for reading from tensor buffers $B_0^{(m)}$, $B_1^{(m)}$, $P_0^{(m)}$, $X_0^{(m)}$ and $X_1^{(m)}$, and the data from read port 0 is provided to processing circuitry 505.

For applications having an intra-module network-in-network tensor buffer $B_2^{(m)}$, the memory controller provides the read control signals to read port 1 (R1) for reading from the network-in-network tensor buffer, and the data from read port 1 is provided to the processing circuitry 505.

Memory controller 506 provides write control signals (write address and write enable signals) for intra-module tensor buffers $B_0^{(m)}$, $B_1^{(m)}$, and $B_2^{(m)}$, to write port 0 of the RAMs/tensor banks 502 and 504, which enables storage of tensor data generated by processing circuitry 505.

Write control signals for the intra-module parallel pipeline tensor buffer $P_0^{(m)}$ are provided by the memory controller of module m to write port 1 (W1) of the RAMs/tensor banks, and the processing circuitry writes $P_0^{(m)}$ tensor data to write port 1.

Write port 2 (W2) is dedicated to inter-module tensor buffers $X_0^{(m)}$ and $X_0^{(m)}$. The write control signals and inter-module tensor data are provided by the memory controller of module m−1. Similarly, memory controller 506 of module m provides write control signals 516 to write port 2 of the RAM/tensor banks (not shown) associated module m+1 for enabling storage of the inter-module tensor buffers $X_0^{(m+1)}$ and $X_1^{(m+1)}$.

Though Table 1 shows that read port 0 covers all addresses, and each of the other ports covers a subset of addresses of a memory, it will be appreciated that all the ports could cover all addresses of the memory if the memory were made with 2 read-3 write port memory cells.

Figure 8:
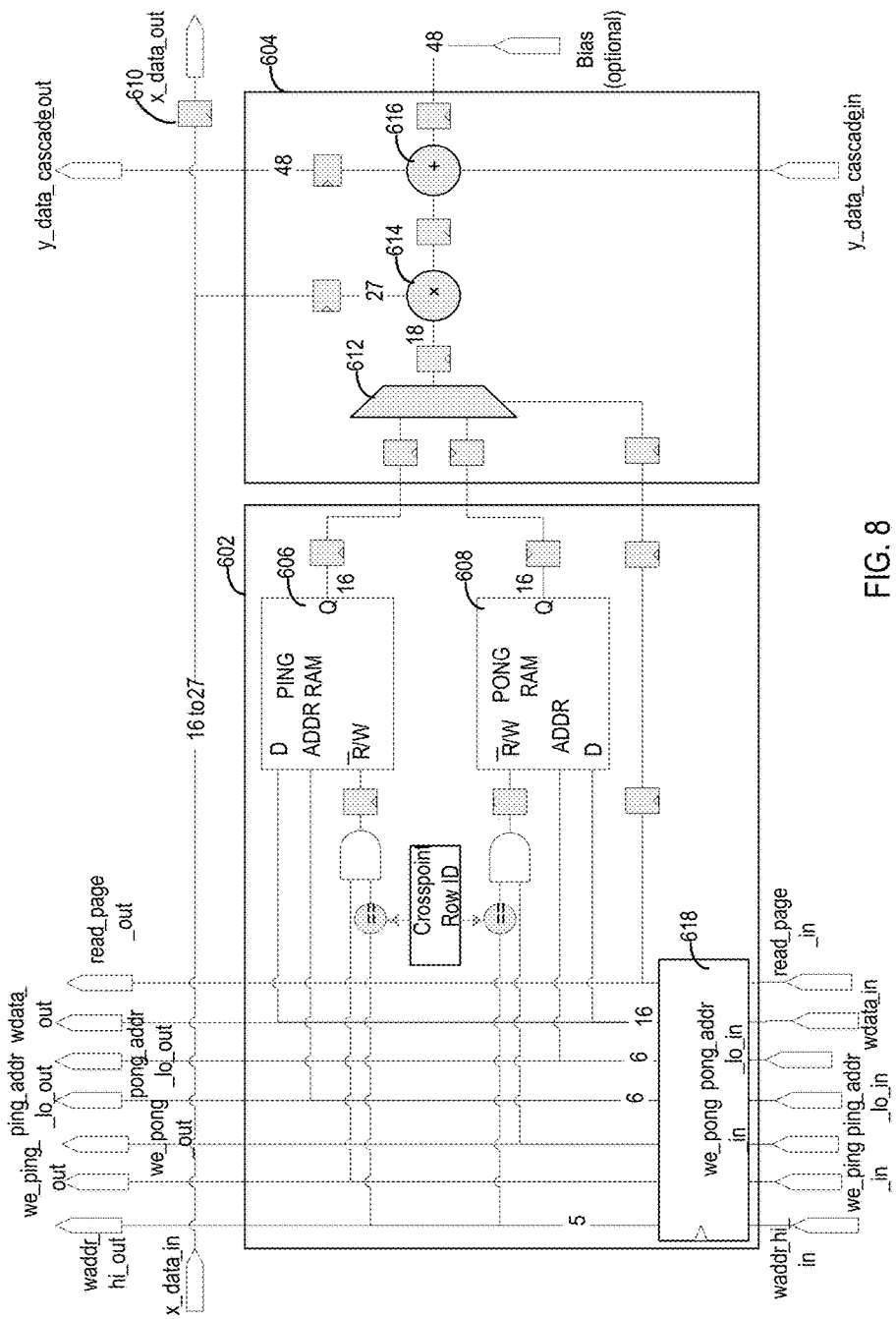
FIG. 8 is a circuit diagram of a processing element, consistent with implementations of the present disclosure.

FIG. 8 is a circuit diagram of a processing element, consistent with implementations of the present disclosure. The circuit diagram shows an example of a processing element that can be used with various implementations discussed and depicted herein. The processing element includes a local memory block 602 and an arithmetic unit 604. The local memory block has two memory circuits 606 and 608, each of which have a respective input (D) and output port (Q). The multiplexer 612 selects between the outputs in response to the read_page signal. The read_page signal identifies the portion (or page) of the combined memory space that is currently active.

According to certain implementations, each memory circuit 606 and 608 can operate in either read or write mode, but not both modes concurrently. The mode is determined by the status of the R/W input signal. The R/W inputs of the memory circuits 606 and 608 are controlled by the we_ping and we_pong signals, respectively. The we_ping and we_pong signals can be further gated by a comparison of the waddr_hi signal to a Crosspoint Row ID of the processing element. Each processing element can be assigned a different ID so that different masks can be loaded into each processing element, while still using a shared data bus (wdata). According to various implementations, the two different address busses for the low address bits (ping_addr_lo and pong_addr_lo) are used to differentiate between the write and read pointers. For example, the ping_addr_lo can be driven by the read pointer when memory circuit 606 is active, while the pong_addr_lo can be driven by the write pointer. The read and write pointers can be swapped between the ping and pong address busses in response to a change in their respective active/inactive states.

Arithmetic unit 604 includes multiplier 614 and adder 616, which perform the tensor operations on input slice data received on the X_data signal line. Multiplier 614 also takes the output of the multiplexer 612 as an input to the tensor operation. The output of multiplier 614 is provided to the adder 616 along with data from the y_data_cascade signal. The y_data_cascade signal is provided from an output of prior processing elements in the column. If the processing element is the first processing element in the column, the source of the signal can correspond to an initialization value that can be stored in the processing element or elsewhere. The adder 616 can also receive a bias input, depending upon the particular implementation.

FIG. 8 shows a number of clocked registers (flip-flops) represented by boxes with input clock (triangle) symbols. The registers can be used to provide appropriate signal timings. For instance, register block 618 synchronizes and delays the control and data signals used by the memory circuits 606 and 608. The register block 618 can be useful for delaying the control signals at each point along the column so as to maintain synchronicity with the y_data_cascade data input. As another example, register 610 can be used for pipelining the row data relative to a subsequent processing element in the row.

Figure 9:
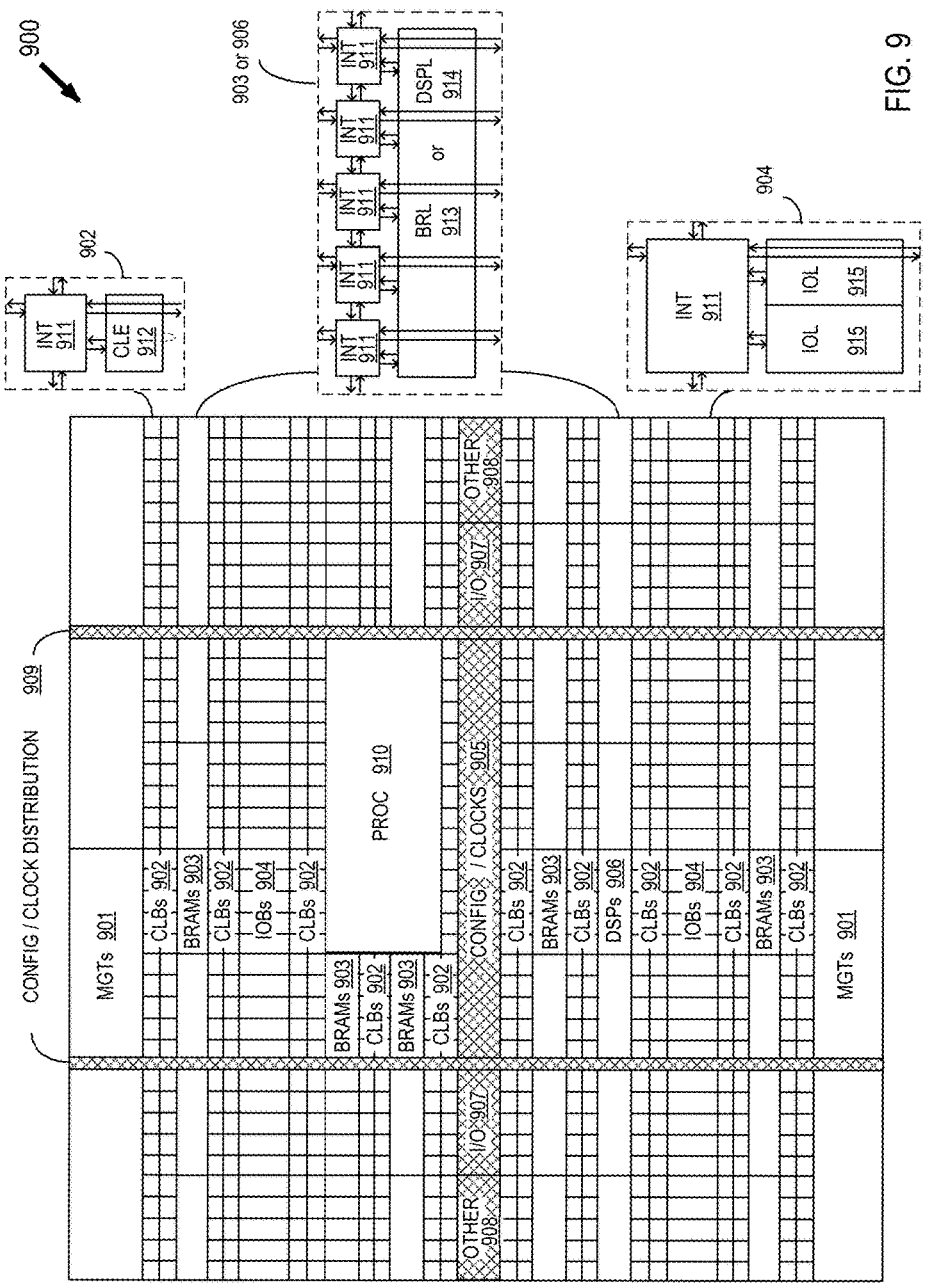
FIG. 9 shows a programmable integrated circuit (IC) on which the disclosed circuits and processes may be implemented.

FIG. 9 shows a programmable integrated circuit (IC) 900 on which the disclosed circuits and processes may be implemented. The programmable IC may also be implemented as an SoC or an SiP, which includes field programmable gate array logic (FPGA) along with other programmable resources. FPGA logic may include several different types of programmable logic blocks in the array. For example, FIG. 9 illustrates programmable IC 900 that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, clock ports, and other programmable logic 908 such as digital clock managers, analog-to-digital converters, system monitoring logic, and so forth. Some programmable IC having FPGA logic also include dedicated processor blocks (PROC) 910 and internal and external reconfiguration ports (not shown).

In some FPGA logic, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA logic. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL) 914 in addition to an appropriate number of programmable interconnect elements. An IOB 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 909 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 9 include additional logic blocks that disrupt the regular columnar structure making up a large part of the programmable IC. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of neural networks. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement comprising:
    a plurality of random access memory (RAM) circuits, each RAM circuit including at least one read port and at least one write port;
    a memory controller configured to access tensor data arranged in a plurality of banks of tensor buffers in the plurality of RAM circuits, coupled to the at least one read port of each of the plurality of RAM circuits by a shared read address bus and a shared read enable signal line, and coupled to the at least one write port of each of the plurality of RAM circuits by a shared write address bus and a respective subset of a plurality of write enable signal lines, wherein the memory controller is further configured to generate read addresses, a read enable signal, write addresses, and write enable signals for accessing different ones of the tensor buffers in the plurality of RAM circuits at different times; and
    an array of processing circuits including a plurality of rows and a plurality of columns of processing circuits, wherein each subset of a plurality of subsets of rows of the processing elements is coupled to the at least one read port of a respective one of the RAM circuits by a read data bus, and a last row of processing elements is coupled to the at least one write port of each of the plurality of RAM circuits by a write data bus, wherein:
    the array of processing circuits is configured to perform tensor operations on the tensor data; and
    the processing circuits in each row in the array of processing circuits are coupled to input the same tensor data.

2. The circuit arrangement of claim 1, wherein the tensor buffers include inter-module tensor buffers and intra-module tensor buffers, and each bank includes at least one inter-module tensor buffer and at least one intra-module tensor buffer.

3. The circuit arrangement of claim 1, wherein:
    the at least one read port of each RAM circuit includes a first read port and a second read port, and the at least one write port of each RAM circuit includes a first write port and a second write port; and
    the memory controller is further configured to, for each RAM circuit:
        generate addresses and a read enable signal that address a first subset of the tensor buffers via the first read port,
        generate addresses and a read enable signal that address a second subset of the tensor buffers via the second read port,
        generate addresses and a write enable signal that address a third subset of the tensor buffers via the first write port, and
        generate addresses and a write enable signal that address a fourth subset of the tensor buffers via the second write port.

4. The circuit arrangement of claim 1, wherein the tensor buffers include inter-module tensor buffers and intra-module tensor buffers, and each bank includes at least one inter-module tensor buffer and at least one intra-module tensor buffer, and the memory controller is further configured to:
    alternate between enabling writing of data to inter-module tensor buffers X0 and X1 of the tensor buffers for data from another array of processing circuits; and
    alternate between enabling reading of data from the tensor buffers X0 and X1 by the array of processing circuits.

5. The circuit arrangement of claim 1, wherein the tensor buffers includes inter-module tensor buffers and intra-module tensor buffers, and each bank includes at least one inter-module tensor buffer and at least one intra-module tensor buffer, and the memory controller is further configured to:
    alternate between enabling writing of data to intra-module tensor buffers B0 and B1 of the tensor buffers; and
    alternate between enabling reading of data from the tensor buffers B0 and B1 by the array of processing circuits.

6. The circuit arrangement of claim 5, wherein the memory controller is further configured to:
    alternate between enabling writing of data to intra-module tensor buffers B2 and B3 of the tensor buffers; and
    alternate between enabling reading of data from the tensor buffers B2 and B3 by the array of processing circuits.

7. The circuit arrangement of claim 1, wherein:
    the at least one read port of each RAM circuit includes a first read port and a second read port, and the at least one write port of each RAM circuit includes a first write port, a second write port, and a third write port; and
    the memory controller is further configured to, for each RAM circuit:

generate addresses and a read enable signal that address a first subset of the tensor buffers via the first read port, generate addresses and a read enable signal that address a second subset of the tensor buffers via the second read port, generate addresses and a write enable signal that address a third subset of the tensor buffers via the first write port, generate addresses and a write enable signal that address a fourth subset of the tensor buffers via the second write port, and generate addresses and a write enable signal that address a fifth subset of the tensor buffers via the third write port.

8. The circuit arrangement of claim 7, wherein for modules m and m+1:

the first subset of the tensor buffers includes inter-module tensor buffers $X_0^{(m)}$ and $X_1^{(m)}$ and intra-module tensor buffers B0, B1, P0;

the second subset of the tensor buffers includes intra-module tensor buffer B2;

the third subset of the tensor buffers includes intra-module tensor buffers B0, B1, and B2;

the fourth subset of the tensor buffers includes intra-module tensor buffer P0; and the fifth subset of the tensor buffers includes inter-module tensor buffers $X_0^{(m+1)}$ and $X_1^{(m+1)}$.

9. The method of claim 1, wherein the tensor buffers includes inter-module tensor buffers and intra-module tensor buffers, and each bank includes at least one inter-module tensor buffer and at least one intra-module tensor buffer, and the method further comprising:

alternating between enabling writing of data to intra-module tensor buffers B0 and B1 of the tensor buffers; and alternating between enabling reading of data from the tensor buffers B0 and B1 by the array of processing circuits.

10. A circuit arrangement comprising:

a plurality of N modules that are coupled in a pipeline, wherein a second module through the Nth module of the plurality of N modules in the pipeline inputs tensor data output from a previous module of the plurality of N modules in the pipeline, and each module includes:

a plurality of RAM circuits, each RAM circuit including at least one read port and at least one write port;

a memory controller configured to access tensor data arranged in a plurality of banks of tensor buffers in the plurality of RAM circuits, coupled to the at least one read port of each of the plurality of RAM circuits by a shared read address bus and a shared read enable signal line, and coupled to the at least one write port of each of the plurality of RAM circuits by a shared write address bus and a respective subset of a plurality of write enable signal lines, wherein the memory controller is further configured to generate read addresses, a read enable signal, write addresses, and write enable signals for accessing different ones of the tensor buffers in the plurality of RAM circuits at different times; and an array of processing circuits including a plurality of rows and a plurality of columns of processing circuits, wherein each subset of a plurality of subsets of rows of the processing elements is coupled to the at least one read port of a respective one of the RAM circuits by a read data bus, and a last row of processing elements is coupled to the at least one write port of each of the plurality of RAM circuits by a write data bus, wherein:

the array of processing circuits is configured to perform tensor operations on the tensor data; and the processing circuits in each row in the array of processing circuits are coupled to input the same tensor data.

11. The circuit arrangement of claim 10, wherein the tensor buffers includes inter-module tensor buffers and intra-module tensor buffers, and each bank includes at least one inter-module tensor buffer and at least one intra-module tensor buffer.

12. The circuit arrangement of claim 10, wherein:

the at least one read port of each RAM circuit includes a first read port and a second read port, and the at least one write port of each RAM circuit includes a first write port and a second write port; and the memory controller is further configured to, for each RAM circuit:

generate addresses and a read enable signal that address a first subset of the tensor buffers via the first read port, generate addresses and a read enable signal that address a second subset of the tensor buffers via the second read port, generate addresses and a write enable signal that address a third subset of the tensor buffers via the first write port, and generate addresses and a write enable signal that address a fourth subset of the tensor buffers via the second write port.

13. The circuit arrangement of claim 10, wherein the tensor buffers include inter-module tensor buffers and intra-module tensor buffers, and each bank includes at least one inter-module tensor buffer and at least one intra-module tensor buffer, and the memory controller is further configured to:

alternate between enabling writing of data to inter-module tensor buffers X0 and X1 of the tensor buffers for data from another array of processing circuits; and alternate between enabling reading of data from the tensor buffers X0 and X1 by the array of processing circuits.

14. The circuit arrangement of claim 10, wherein the tensor buffers includes inter-module tensor buffers and intra-module tensor buffers, and each bank includes at least one inter-module tensor buffer and at least one intra-module tensor buffer, and the memory controller is further configured to:

alternate between enabling writing of data to intra-module tensor buffers B0 and B1 of the tensor buffers; and alternate between enabling reading of data from the tensor buffers B0 and B1 by the array of processing circuits.

15. The circuit arrangement of claim 14, wherein the memory controller is further configured to:

alternate between enabling writing of data to intra-module tensor buffers B2 and B3 of the tensor buffers; and alternate between enabling reading of data from the tensor buffers B2 and B3 by the array of processing circuits.

16. The circuit arrangement of claim 10, wherein:

the at least one read port of each RAM circuit includes a first read port and a second read port, and the at least one write port of each RAM circuit includes a first write port, a second write port, and a third write port; and the memory controller is further configured to, for each RAM circuit:

generate addresses and a read enable signal that address a first subset of the tensor buffers via the first read port, generate addresses and a read enable signal that address a second subset of the tensor buffers via the second read port, generate addresses and a write enable signal that address a third subset of the tensor buffers via the first write port, generate addresses and a write enable signal that address a fourth subset of the tensor buffers via the second write port, and generate addresses and a write enable signal that address a fifth subset of the tensor buffers via the third write port.

17. The circuit arrangement of claim 16, wherein for modules m and m+1:

the first subset of the tensor buffers includes inter-module tensor buffers $X_0^{(m)}$ and $X_1^{(m)}$ and intra-module tensor buffers B0, B1, P0;

the second subset of the tensor buffers includes intra-module tensor buffer B2;

the third subset of the tensor buffers includes intra-module tensor buffers B0, B1, and B2;

the fourth subset of the tensor buffers includes intra-module tensor buffer P0; and the fifth subset of the tensor buffers includes inter-module tensor buffers $X_0^{(m+1)}$ and $X_1^{(m+1)}$.

18. A method comprising:

generating by a memory controller, read addresses, a read enable signal, write addresses, and a plurality of write enable signals for accessing tensor data in different ones of a plurality of tensor buffers at different times, wherein the tensor data is arranged in a plurality of banks of tensor buffers in a plurality of RAM circuits, and each RAM circuit includes at least one read port and at least one write port;

transmitting each read address and read enable signal in parallel from the memory controller to the at least one read port of all of the plurality of RAM circuits;

transmitting each write address in parallel from the memory controller to the at least one write port of all of the plurality of RAM circuits;

transmitting a subset of the plurality of write enable signals to the at least one write port of one of the plurality of RAM circuits, respectively;

inputting tensor data from the plurality of RAM circuits to an array of processing circuits including a plurality of rows and a plurality of columns of processing circuits, wherein each subset of a plurality of subsets of rows of the processing elements is coupled to the at least one read port of a respective one of the RAM circuits by a read data bus, and a last row of processing elements is coupled to the at least one write port of each of the plurality of RAM circuits by a write data bus, wherein the processing circuits in each row are coupled to input the same tensor data; and performing tensor operations on the tensor data by the array of processing circuits.

19. The method of claim 18, wherein the tensor buffers includes inter-module tensor buffers and intra-module tensor buffers, each bank includes at least one inter-module tensor buffer and at least one intra-module tensor buffer, the at least one read port of each RAM circuit includes a first read port and a second read port, and the at least one write port of each RAM circuit includes a first write port and a second write port, the method further comprising:

generating by the memory controller for each RAM circuit addresses and a read enable signal that address a first subset of the tensor buffers via the first read port, generating by the memory controller for each RAM circuit addresses and a read enable signal that address a second subset of the tensor buffers via the second read port, generating by the memory controller for each RAM circuit addresses and a write enable signal that address a third subset of the tensor buffers via the first write port, and generating by the memory controller for each RAM circuit addresses and a write enable signal that address a fourth subset of the tensor buffers via the second write port.

20. The method of claim 18, wherein the tensor buffers include inter-module tensor buffers and intra-module tensor buffers, and each bank includes at least one inter-module tensor buffer and at least one intra-module tensor buffer, and the method further comprising:

alternating between enabling writing of data to inter-module tensor buffers X0 and X1 of the tensor buffers for data from another array of processing circuits; and alternating between enabling reading of data from the tensor buffers X0 and X1 by the array of processing circuits.

* * * * *